United States Patent [19]
Narita

[11] Patent Number: 4,778,395
[45] Date of Patent: Oct. 18, 1988

[54] HEADER APPARATUS

[75] Inventor: Hiroshi Narita, Tokyo, Japan

[73] Assignee: E. I. Du Pont de Nemours and Company, Wilmington, Del.

[21] Appl. No.: 111,321

[22] Filed: Oct. 22, 1987

[30] Foreign Application Priority Data

Oct. 27, 1986 [JP] Japan .......................... 61-164589[U]

[51] Int. Cl.⁴ .......................................... H05K 1/00
[52] U.S. Cl. .................................. 439/71; 439/159; 439/525
[58] Field of Search ............... 439/152, 153, 155, 156, 439/157, 159, 160, 180, 259, 261, 264, 266, 267, 330, 331, 341, 525, 526, 55, 68, 70–74

[56] References Cited

U.S. PATENT DOCUMENTS

| | | | |
|---|---|---|---|
| 2,987,693 | 6/1961 | Walmsley | 339/91 |
| 4,070,081 | 1/1978 | Takahashi | 339/91 |
| 4,232,926 | 11/1980 | Inouye et al. | 339/45 |
| 4,498,047 | 2/1985 | Hexamu et al. | 439/152 |
| 4,582,379 | 4/1986 | Fasano | 339/45 |
| 4,623,208 | 11/1986 | Kerul et al. | 439/71 |
| 4,669,796 | 6/1987 | Carter | 439/71 |

FOREIGN PATENT DOCUMENTS 0018338 1/1982 Japan .................................. 439/155

OTHER PUBLICATIONS

U.S. patent application Ser. No. 116,586; Filed 11/4/87 Entitled Header Device; Inventor: Hiroshi Narita.

Primary Examiner—David Pirlot

[57] ABSTRACT

A header apparatus for a flat IC pack having at least one conductive terminal includes a header housing which includes an IC pack chamber, an opening communicating with the IC pack chamber, the IC pack being inserted into and extracted from the opening, and a pair of actuation means, each of which includes drive member having a first surface formed inside the IC pack chamber of the header housing and a first rack, operation member which includes a second rack positioned to face the first rack of the drive means and an operation portion formed outside the IC pack chamber, and a pinion engaged with the first and second racks, wherein the first surface of the drive member is moved in an insertion direction of the IC pack by inserting the IC pack into the IC pack chamber, and pushes the IC pack inserted into the IC pack chamber in a direction opposite to the insertion direction of the IC pack by moving the operation portion of the operation means in the insertion direction of the IC pack.

6 Claims, 2 Drawing Sheets

HEADER APPARATUS

BACKGROUND OF THE INVENTION

1. Field of the Invention

The present invention relates to a header apparatus and, more particularly, to a header apparatus for connecting an IC pack having a semiconductor circuit to another semiconductor circuit.

2. Description of the Prior Art

A header apparatus used for connecting a semiconductor circuit, such as a memory and a CPU, arranged in a card-like flat IC pack to an external circuit, e.g., a main unit is basically arranged such that the IC pack is inserted into a chamber of an insulated header housing. A large number of pins are aligned on an end face of a deep portion of the chamber. One end of each of these connecting pins extends outside the housing and is connected to a predetermined connecting portion of the main unit. The other end of each of the connecting pins extends inside the housing and is to be engaged to a corresponding socket terminal fixed to the end face of the IC pack. The IC pack inserted into the header housing is extracted as needed.

In such a header apparatus, a so-called pulling force (to extract an IC pack) between the respective pins disposed in the header housing and the respective socket terminals of the IC pack must be relatively large, due to the tight fit required to obtain a good electrical contact. These connecting pins and socket terminals are disposed at a high density due to contemporary advances in high-packing density mounting of semiconductor circuits.

When the IC pack is to be extracted from the header housing, the IC pack is held with fingers and pulled. However, since a large number of the connecting pins and socket terminals are disposed in a high density, and a large pulling force between the pins and the sockets is required in order to extract the IC pack, the pack must be pulled with a great force against the fitting friction between them. Furthermore, since the IC pack is extracted by hand, an extracting direction is not constant, and hence the connecting pins and socket terminals may be damaged.

SUMMARY OF THE INVENTION

It is an object of the present invention to provide a header apparatus which allows an IC pack to be easily extracted and, more particularly, a header apparatus which allows an IC card having a large number of pins to be easily extracted.

It is another object of the present invention to provide a header apparatus which allows an IC pack to be extracted without damaging any of the pin terminals.

In order to achieve the above objects, there is provided a header apparatus for a flat IC pack having at least one conductive terminal, comprising:

a header housing which includes an IC pack chamber, an opening communicating with the IC pack chamber, said IC pack being inserted into and extracted from said opening, and a conductive terminal, said electrical terminal being engaged with the conductive terminal of said IC pack inserted into said IC pack chamber, and at least one actuation means which includes drive means having a first surface formed inside the IC pack chamber of said header housing, and a first transmission surface, operation means which includes a second transmission surface positioned to face said first transmission surface of said drive means, and an operation portion formed outside said IC pack chamber, and transmission means for driving said first surface of said drive means upon movement of said operation portion of said operation means; wherein said first surface of said drive means is moved in an insertion direction of said IC pack by inserting said IC pack into said IC pack chamber, and pushes said IC pack, which is inserted into said IC pack chamber of said header housing, in a direction opposite to the insertion direction of said IC pack by moving said operation portion of said operation means in the insertion direction of said IC pack.

Preferably, a header apparatus according to the present invention includes a pinion concentrically rotatabl about an axis, a drive member and an operation member, these members being meshed with the pinion and moved in opposite directions relative to each other. The drive member is pushed to a deep portion of the chamber by pushing the IC pack into the chamber, and simultaneously moving the operation member toward the user. Alternately, if the operation member is pushed away from the user, the drive member is moved toward the user simultaneously with the movement of the operation member, and pushes the IC pack toward the user, so as to be extracted.

Therefore, according to this header apparatus, both insertion and extraction of the IC pack can be performed by a user's pushing operation.

DETAILED DESCRIPTION OF THE PREFERRED EMBODIMENT

Figure 1:
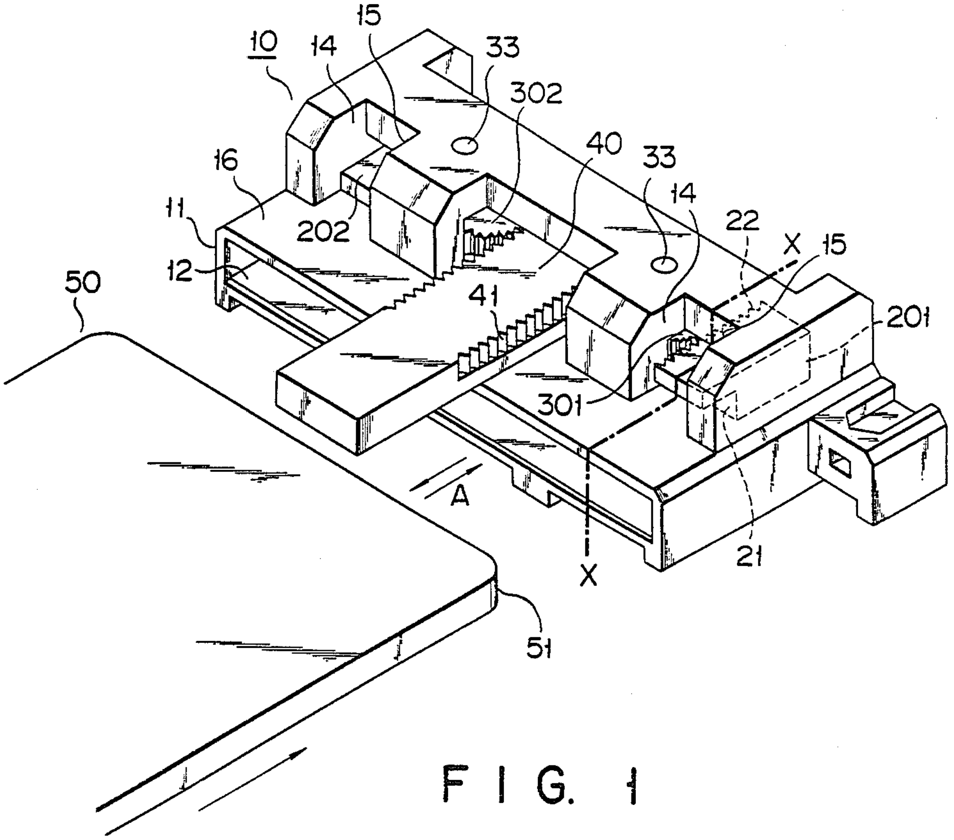
FIG. 1 is a perspective view of a header apparatus according to an embodiment of the present invention.

A header apparatus according to an embodiment of the present invention will be described in detail with reference to the accompanying drawings hereinafter. FIG. 1 is a perspective view of the header apparatus. Header apparatus 10 is basically constituted by housing 11. Header housing 11 includes an IC pack chamber 12. A plurality of connecting pins are aligned on a deep portion of the chamber such that these connecting pins 17 are fitted and connected to socket terminals fixed to end portion 51 of IC pack 50. Thus, a semiconductor circuit mounted on IC pack 50 is connected to a circuit of a main unit (not shown) to which header apparatus 10 is connected.

In header housing 11, a pair of drive members 201 and 202 are provided. Drive members 201 and 202 are respectively fitted into a pair of slots 13 (refer to FIGS. 2 and 3) formed by cutting portions header housing 11. The size of slots 13 is made so large that drive members 201 and 202 can be freely moved in the IC pack insertion/extraction directions (A). Each of drive members 201 and 202 has surface 21 and rack 22. Surfaces 21 are exposed to the chamber 12 and may be brought into contact with end face 51 of IC pack 50. Racks 22 are located outside of the chamber.

The side surfaces, on which racks 22 of drive members 201 and 202 are formed, extend in a direction parallel to the IC pack insertion/extraction directions. Guide walls 14 and 15 are formed on the upper wall of housing 11 to extend along the IC pack insertion/extraction directions so as to define the linear movement direction of drive members 201 and 202.

Operation member 40 is mounted on upper wall 16 of housing 11 between drive members 201 and 202. Operation member 40 is arranged so as to move in a direction parallel to IC pack insertion/extraction directions. Racks 41 are formed on both side surfaces of operation member 40.

A pair of pinions 301 and 302 are fixed on both sides of operation member 40 and meshed with racks 41 of operation member 40 and racks 22 of drive members 201 and 202. A shaft 33 of each of pinions 301 and 302 vertically extends in a direction perpendicular to the IC pack insertion/extraction directions, and rotatably supports a corresponding one of pinions 301 and 302.

Figure 4:
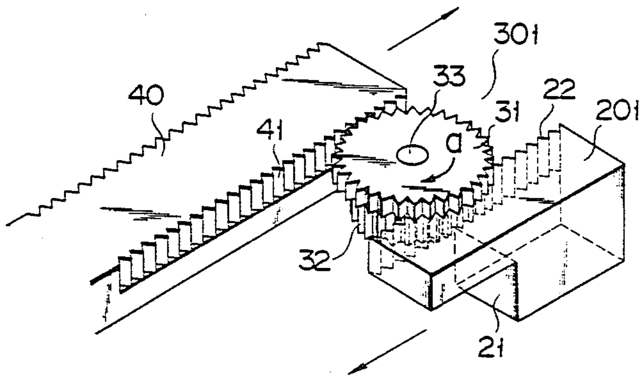
FIG. 4 shows a pinion member and an operation member of the header apparatus.

FIG. 4 shows a portion related to pinion 301. When operation member 40 is moved in a direction indicated by the arrow, pinion 301 is rotated in direction a so that drive member 201 is linearly moved opposite to the movement of operation member 40. Pinion 301 consists of concentrically coupled pinions 31 and 32 having different diameters. When large- and small-diameter pinions 31 and 32 are respectively meshed with rack 41 of operation member 40 and with rack 22 of drive members 201, a driving force of drive member 201 is enhanced by operation member 40 due to the radius ratio of these pinions. Although not shown in FIG. 4, a part corresponding to pinion 302 is arranged in the same manner as pinion 301.

Figure 2:
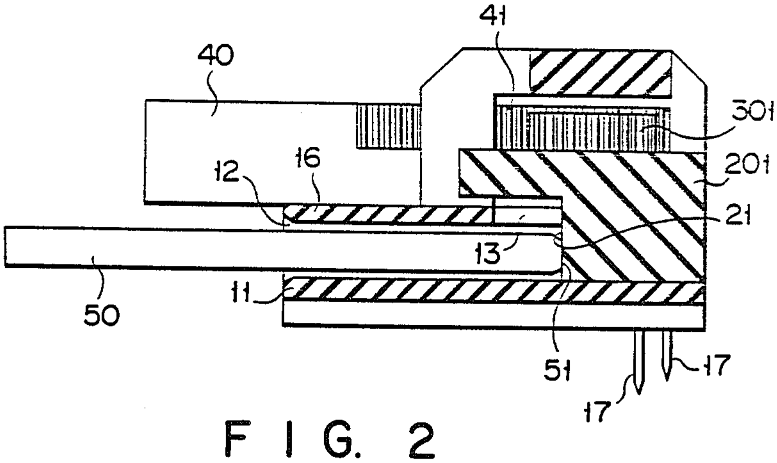
FIG. 2 is a sectional view taken along the line X—X of FIG. 1 wherein an IC pack is inserted into the header apparatus.

In the header apparatus thus arranged, IC pack 50 is inserted through opening into the IC chamber 12 of housing 11 by, e.g., a hand. When the IC pack is inserted, and face 51 is brought into contact with contact surfaces 21 of drive members 201 and 202. Then, if the IC pack is kept pushed into the housing, drive members 201 and 202 are pushed, and operation member 40 is moved toward the user with rotational movement of pinions 301 and 302. FIG. 2 shows a state in which nsertion of the IC pack is completed. Although not shown in FIG. 2, the socket terminals in IC pack 50 and connecting pins 17 of header apparatus 10 are electrically connected together.

Figure 3:
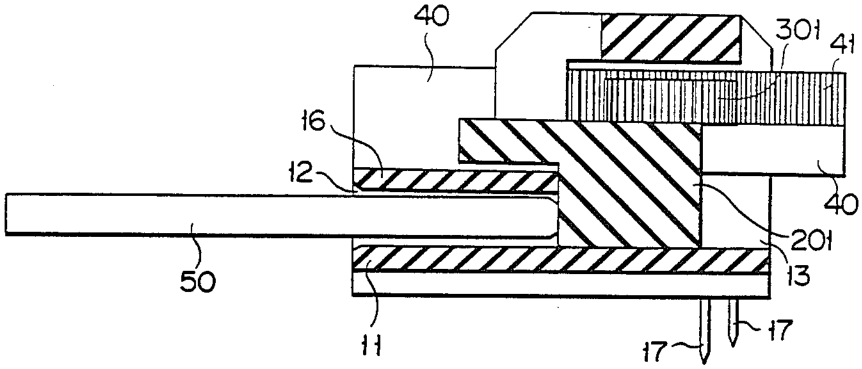
FIG. 3 is a sectional view taken along the line X—X of FIG. 1 wherein the IC pack is extracted by a drive member of the header apparatus.

When IC pack 50 is to be extracted, operation member 40 is pushed away from the user. Pushing IC pack toward the user, drive members 201 and 202 move toward the user, and hence IC pack 50 is extracted as shown in FIG. 3. In this state, since all the pins of header apparatus 10 are disconnected from the socket terminals of IC pack 50, IC pack 50 can be easily extracted by hand.

In the header apparatus according to the present invention, both insertion of the IC pack and extraction thereof can be performed by pushing. In general, since pushing is advantageous over pulling, an IC pack is efficiently inserted and extracted. Furthermore, in this case, since each of pinions 301 and 302 consists of large- and small-diameter pinions, even if the number of pins of the header apparatus is large and a great pulling force is required to extract the IC pack, operation member 40 can be easily moved.

Accordingly, in the header apparatus, since IC pack 50 is pushed straightforwardly by a pair of drive members 201 and 202 in a direction parallel to the plane of the IC pack, the pins extending on the IC pack are not damaged. More specifically, when the IC pack is extracted directly by hand, as in the conventional case, the pack and the header may scrape against each other or the pins may be damaged because, e.g., the IC pack is obliquely extracted. However, when the IC pack is pushed in a correct direction by drive members 201 and 202, these problems do not occur.

The effects of the present invention can also be obtained by a single drive member and a single pinion.

Operation member 40 does not need to be disposed in the center of the header. However, when the operation member is disposed in the center of the header, and the pinions and the drive members are symmetrically disposed on the both sides of the operation member, an arrangement of additional parts required to fix header apparatus 10 is simplified.

Since an IC pack has been extracted by hand, if the overall pack was inserted into a main body casing on which a header was mounted, the IC pack could not be extracted again. For this reason, in the prior art, a portion needed to be partially left outside the body casing when connection between the IC pack and the header was completed, and hence the pack protruded from the body casing, resulting in a poor appearance. However, according to the header apparatus described in the above embodiment, the overall IC pack can be completely inserted into the body casing.

What is claimed is:

1. A header apparatus for a flat IC pack having at least one conductive terminal, comprising:

a header housing which includes
- an IC pack chamber,
- an opening communicating with the IC pack chamber, said IC pack being inserted into and extracted from said opening, and
- an electrical terminal being engaged with the conductive terminal of said IC pack inserted into said IC pack chamber, and at least one actuation means which includes
- a drive member having a first surface formed inside the IC pack chamber of said header housing, and a first transmission surface, said drive member also having a first rack formed on said first transmission surface,
- an operation member which includes a second transmission surface positioned to face said first transmission surface of said drive member and a second rack formed on said said transmission surface, and an operation portion formed about an axis, and through which said first and second racks are meshed with each other, and
- transmission means for driving said first surface of said drive member upon movement of said operation portion of said operation member; wherein
- said first surface of said drive member is moved in an insertion direction of said IC pack by inserting said IC pack into said IC pack chamber, and pushes said IC pack, which is inserted into said IC pack chamber of said header housing, in a direction opposite to the insertion direction of said IC pack by moving said operation portion of said operation member in the insertion direction of said IC pack.

2. An apparatus according to claim 1, wherein said first surface of said drive member is perpendicular to the plane of said IC pack, said operation member has an elongated shape extending in the insertion/extraction directions of said IC pack, and has said second rack on at least one of the sides thereof, and said pinion is parallel to the plane of said IC pack.

3. An apparatus according to claim 1, wherein said pinion includes first and second pinions having the same axis, said first and second pinions being meshed with said first and second racks respectively, and said first pinion having a smaller radius than that of said second pinion.

4. An apparatus according to claim 1, wherein said drive member, said operation member, and said pinion are made of an insulating material.

5. An apparatus according to claim 1, which comprises a pair of actuation means separated from each other in a direction perpendicular to the insertion direction of said IC pack.

6. An apparatus according to claim 5, wherein said operation member includes a second rack on both sides thereof.

* * * * *

UNITED STATES PATENT AND TRADEMARK OFFICE
CERTIFICATE OF CORRECTION

PATENT NO. : 4,778,395

DATED : October 18, 1988

INVENTOR(S) : Hiroshi Narita

It is certified that error appears in the above-identified patent and that said Letters Patent is hereby corrected as shown below:

Claim 1, column 4, line 57, after "formed" insert -- outside said IC pack chamber and a pinion which is rotated --.

Signed and Sealed this

Seventh Day of March, 1989

*Attest:*

DONALD J. QUIGG

*Attesting Officer*

*Commissioner of Patents and Trademarks*